(12) United States Patent
Kuo et al.

(10) Patent No.: US 7,881,061 B2
(45) Date of Patent: Feb. 1, 2011

(54) MOUNTING DEVICE FOR MOUNTING HEAT SINK ONTO ELECTRONIC COMPONENT

(75) Inventors: Jer-Haur Kuo, Taipei Hsien (TW); Xin-Xiang Zha, Shenzhen (TW); Ye-Fei Yu, Shenzhen (TW); Jun Li, Shenzhen (TW)

(73) Assignees: Fu Zhun Precision Industry (Shen Zhen) Co., Ltd., Shenzhen, Guangdong Province (CN); Foxconn Technology Co., Ltd., Tucheng, Taipei County (TW)

( * ) Notice: Subject to any disclaimer, the term of this patent is extended or adjusted under 35 U.S.C. 154(b) by 192 days.

(21) Appl. No.: 12/239,831

(22) Filed: Sep. 29, 2008

(65) Prior Publication Data
US 2009/0251863 A1  Oct. 8, 2009

(30) Foreign Application Priority Data
Apr. 3, 2008  (CN) .................. 2008 1 0066506

(51) Int. Cl.
*H05K 7/20* (2006.01)
*F28F 7/00* (2006.01)
*H01L 23/34* (2006.01)

(52) U.S. Cl. .............. 361/709; 361/704; 361/719; 165/80.2; 165/80.3; 165/185; 174/16.3; 257/718; 257/719; 24/458; 24/459; 24/520

(58) Field of Classification Search ............ 361/704, 361/709, 710, 719; 165/80.1–80.3, 185; 174/16.1, 16.3; 257/718, 719; 24/458, 459, 24/520

See application file for complete search history.

(56) References Cited

U.S. PATENT DOCUMENTS

| | | | | |
|---|---|---|---|---|
| 5,323,845 A | * | 6/1994 | Kin-shon | 165/80.3 |
| 2003/0214787 A1 | * | 11/2003 | Liu | 361/704 |
| 2006/0291169 A1 | * | 12/2006 | Lee et al. | 361/704 |

* cited by examiner

*Primary Examiner*—Zachary M Pape
(74) *Attorney, Agent, or Firm*—Frank R. Niranjan

(57) ABSTRACT

An electronic apparatus includes a PCB with a heat generating electronic component disposed thereon, a heat sink, and a mounting device for mounting the heat sink onto the heat generating electronic component. The mounting device includes a mounting frame and a wire clip. The mounting frame surrounds the heat sink, and includes two first mounting arms and two second mounting arms disposed above the first mounting arms. The first mounting arms abut on the PCB. A pair of engaging wings are formed on the second mounting arms. The wire clip includes a pivot axle pivotably attached to the mounting frame and two resilient arms at opposite sides of the mounting frame. The resilient arms abut against the heat sink and engage with the engaging wings, thereby exerting a resilient force on the heat sink toward the heat generating electronic component.

15 Claims, 4 Drawing Sheets

MOUNTING DEVICE FOR MOUNTING HEAT SINK ONTO ELECTRONIC COMPONENT

BACKGROUND

1. Field of the Invention

The present invention generally relates to mounting devices, and particularly to a mounting device for mounting a heat sink onto a heat generating electronic component.

2. Description of Related Art

It is well known that heat is generated during operations of a variety of electronic components, such as integrated circuit chips. To ensure normal and safe operations, cooling devices such as heat sinks are often employed to dissipate the generated heat away from these electronic components, and mounting devices are often employed to mount the cooling devices onto these electronic components.

A conventional way to secure the cooling device onto the electronic component is to screw a base of the heat sink onto a PCB on which the electronic component is mounted. However, a magnitude of a force exerted by the screws on the electronic component is difficult to control. If the force is greater than a predetermined value, the electronic component will be damaged. If the force is smaller than the predetermined value, an intimate contact between the heat sink and the electronic component will not be achieved.

What is needed, therefore, is a mounting device which can properly exert a predetermined force on a heat sink to enable the heat sink to have an appropriately intimate engagement with an electronic component.

SUMMARY

The present invention relates to a mounting device for mounting a heat sink to a PCB on which a heat generating electronic component is disposed. According to an embodiment of the present invention, the mounting device includes a mounting frame and a wire clip. The mounting frame has a rectangular configuration and surrounds the heat sink, and includes two opposite first mounting arms and two opposite second mounting arms disposed above the first mounting arms. The first mounting arms abut on the PCB. A pair of engaging wings are formed on the second mounting arms. The wire clip includes a pivot axle pivotably attached to the mounting frame and two resilient arms near the two opposite second mounting arms of the mounting frame. The resilient arms abut downwardly against the heat sink and engage upwardly with the engaging wings, thereby exerting a resilient force on the heat sink toward the heat generating electronic component.

Other advantages and novel features of the present invention will become more apparent from the following detailed description of embodiments when taken in conjunction with the accompanying drawings.

DETAILED DESCRIPTION

Figure 1:
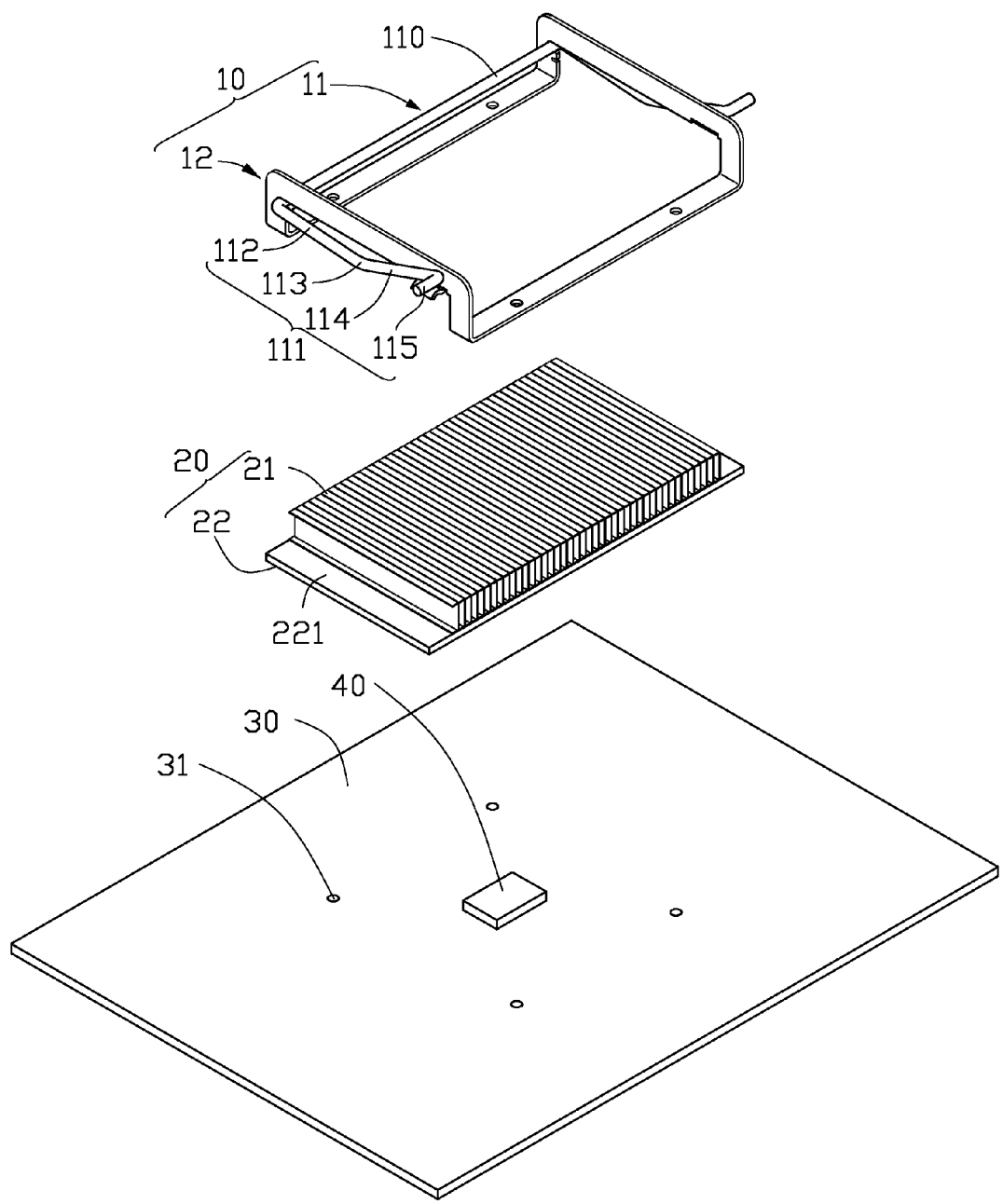
FIG. 1 an exploded, isometric view of an electronic apparatus incorporating a mounting device in accordance with an exemplary embodiment of the present invention.

Reference will now be made to the drawing figures to describe the various present embodiments in detail.

Referring to FIG. 1, an electronic apparatus includes a printed circuit board (PCB) 30, a heat generating electronic component 40, a heat sink 20 and a mounting device 10.

The heat generating electronic component 40 is disposed on the PCB 30. The heat sink 20 is positioned on the heat generating electronic component 40 for dissipating heat generated by the heat generating electronic component 40. The mounting device 10 is used for mounting the heat sink 20 onto the heat generating electronic component 40, thereby enabling the heat sink 20 to have an intimate engagement with the electronic component 40.

The mounting device 10 includes a mounting frame 12 and a wire clip 11. The mounting frame 12 is disposed around the heat sink 20. The wire clip 11 engages with the mounting frame 12 and exerts a resilient force on the heat sink 20 urging the heat sink 20 toward the heat generating electronic component 40.

The wire clip 11 is formed by bending a metal wire. The wire clip 11 includes a linearly-columned pivot axle 110 and two resilient arms 111 extending from opposite ends of the pivot axle 110 along a same direction, whereby the wire clip 11 in whole has a U-shaped configuration. Each of the resilient arms 111 is substantially V-shaped, and includes a first resilient portion 112, a second resilient portion 114, an abutting portion 113 and an operation portion 115. The first resilient portions 112 perpendicularly extend from terminal ends of the pivot axle 110. The second resilient portion 114 extends slantingly and upwardly from a terminal end of the first resilient portion 112, forming an obtuse angle with the first resilient portion 112. The abutting portion 113 is formed at the bottom convex of the obtuse angle, between the first and second resilient portions 112, 114. The operation portion 115 extends outwardly and horizontally from a terminal end of the second resilient portion 114.

Figure 2:
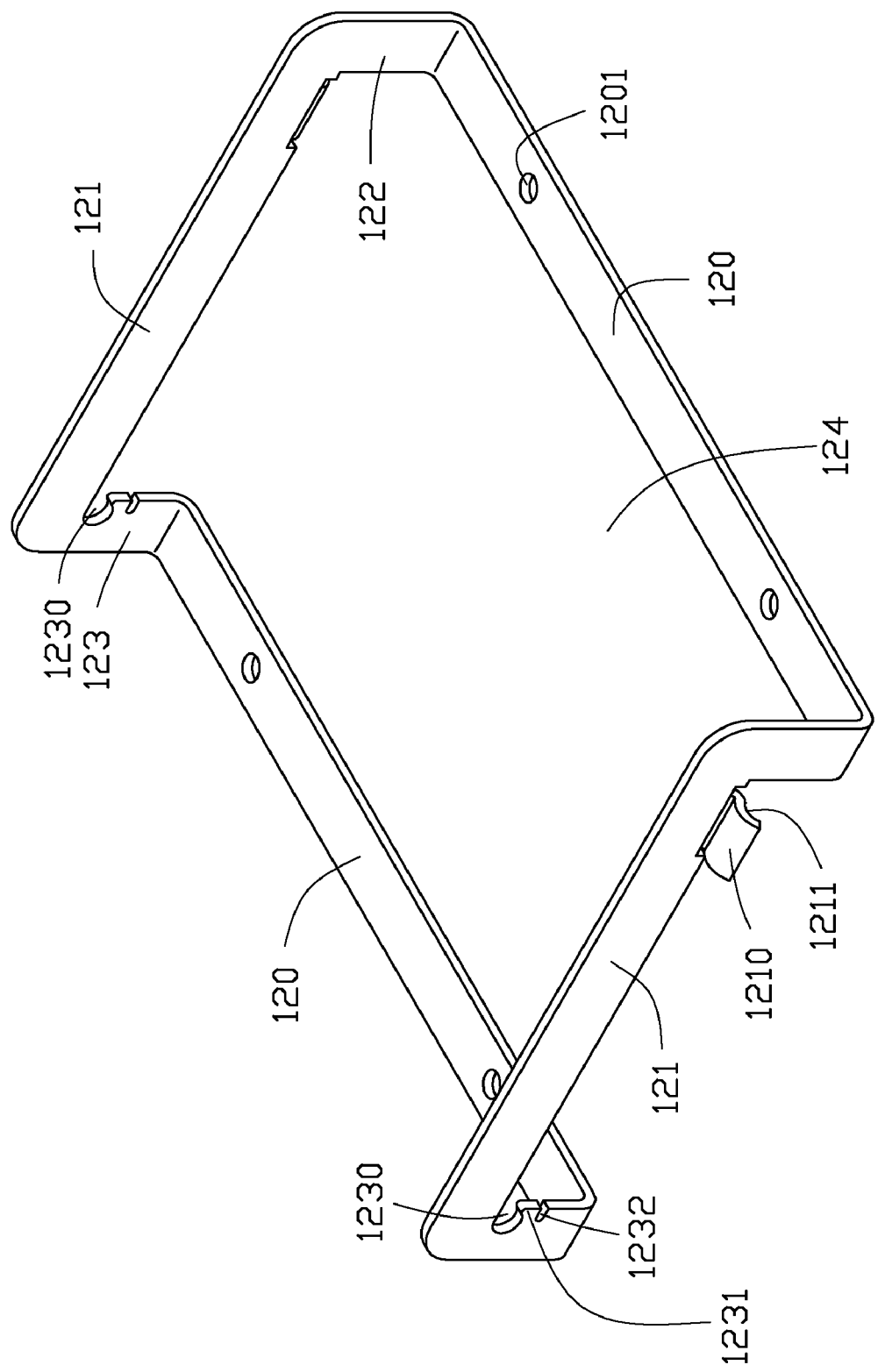
FIG. 2 is an isometric view of a mounting frame of the electronic apparatus of FIG. 1.

Referring to FIG. 2, the mounting frame 12 is substantially rectangular-shaped as viewed from a top thereof and is formed by stamping a metal plate. An inner space 124 is defined in a middle portion of the mounting frame 12, for receiving the heat sink 20 therein. The inner space 124 is enclosed by a pair of opposite first mounting arms 120, a pair of opposite second mounting arms 121, a pair of first connecting arms 123, and a pair of second connecting arms 122. The connecting arms 123, 122 are upright and interconnect the first mounting arms 120 and the second mounting arms 121.

The first mounting arms 120 are disposed at two opposite longer sides of the mounting frame 12, while the second mounting arms 121 are disposed at two opposite shorter sides of the mounting frame 12 which are perpendicular to the longer sides. The first mounting arms 120 are parallel to and space a distance from each other. A pair of mounting holes 1201 are defined in the first mounting arm 120, adjacent to opposite ends of the first mounting arm 120. The first connecting arms 123 extend vertically and upwardly from the opposite ends of one of the first mounting arms 120, while the second connecting arms 122 extend vertically and upwardly from the opposite ends of the other one of the first mounting arms 120. Each of the second mounting arms 121 integrally connects with top ends of adjacent first and second connecting arms 123, 122 and spans across the pair of first mounting arms 120. The first mounting arms 120 space a distance from the second mounting arms 121 along a height direction of the mounting frame 12. In other words, the second mounting arms 121 are located at a higher horizontal level than the first mounting arms 120.

A pair of C-shaped cutouts 1230 are defined at inner sides of the top ends of the first connecting arms 123, for pivotably receiving the pivot axle 110 of the wire clip 11 therein. A bulge 1231 is formed at an opening of the cutout 1230 so that a width of the opening is less than a diameter of the pivot axle 110, preventing the pivot axle 110 from disengaged from the cutout 1230. A pair of slots 1232 are defined adjacent the top ends of the first connecting arms 123, below and adjacent the cutouts 1230, for facilitating portions of the first connecting arms 123 above the slots 1232 to move downwardly when the pivot axle 110 is forcibly inserted through the openings of the cutouts 1230 into the cutouts 1230. A pair of C-shaped engaging wings 1210 integrally and horizontally extend from the second mounting arms 121 at ends remote from the cutouts 1230. A pair of C-shaped notches 1211 are formed at bottom faces of the engaging wings 1210, for receiving the second resilient portions 114 therein.

Referring back to FIG. 1, the heat sink 20 includes a base 22 and a fin assembly 21 arranged on the base 22. Lateral ends of the base 22 space a distance from corresponding lateral ends of the fin assembly 21. Two supporting surfaces 221 are therefore formed at the lateral ends of the base 22.

The heat generating electronic component 40 is arranged on the PCB 30. Four through holes 31 are defined in the PCB 30, surrounding the heat generating electronic component 40.

Figure 3:
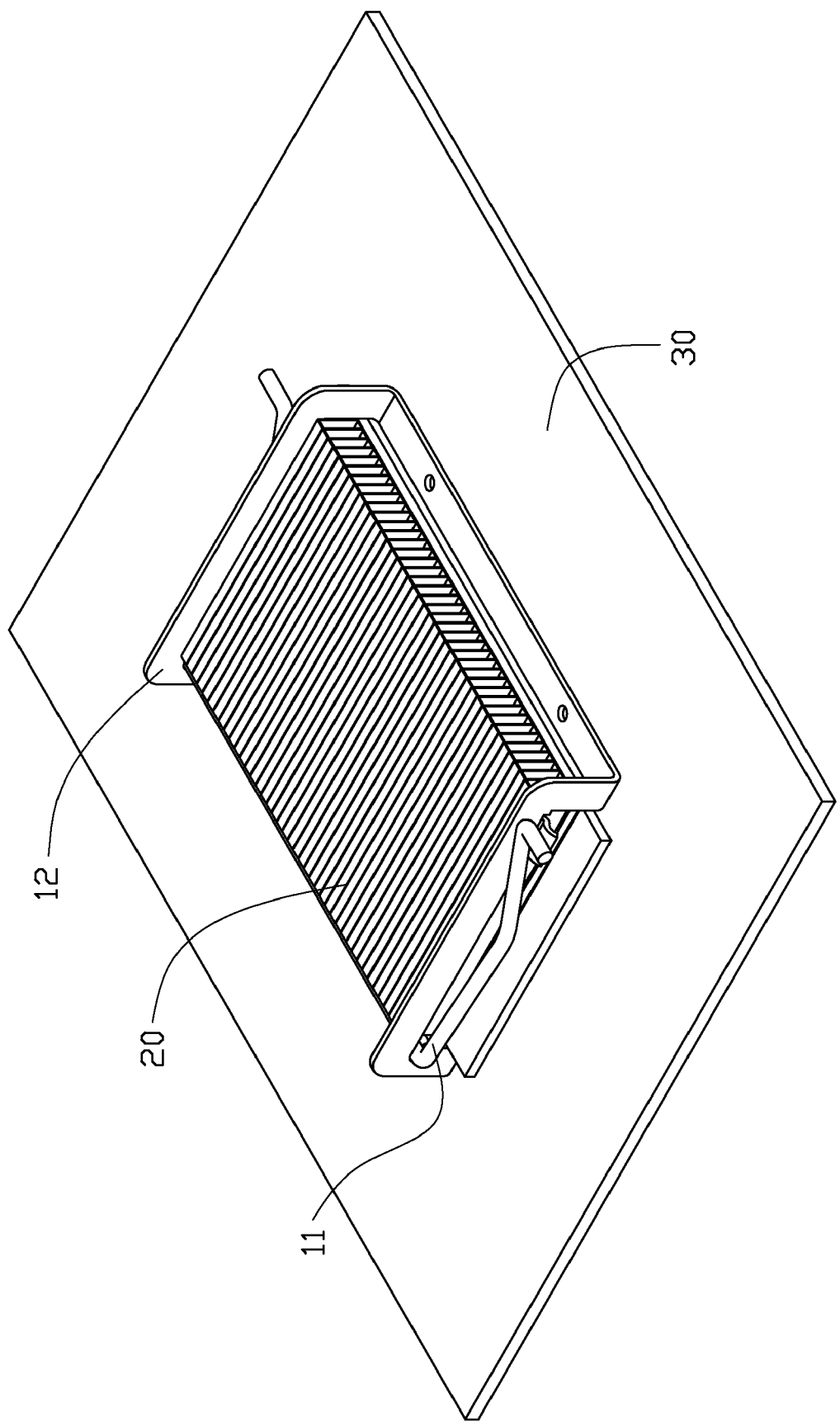
FIG. 3 is an isometric view of the electronic apparatus showing resilient arms of a wire clip above engaging wings.
Figure 4:
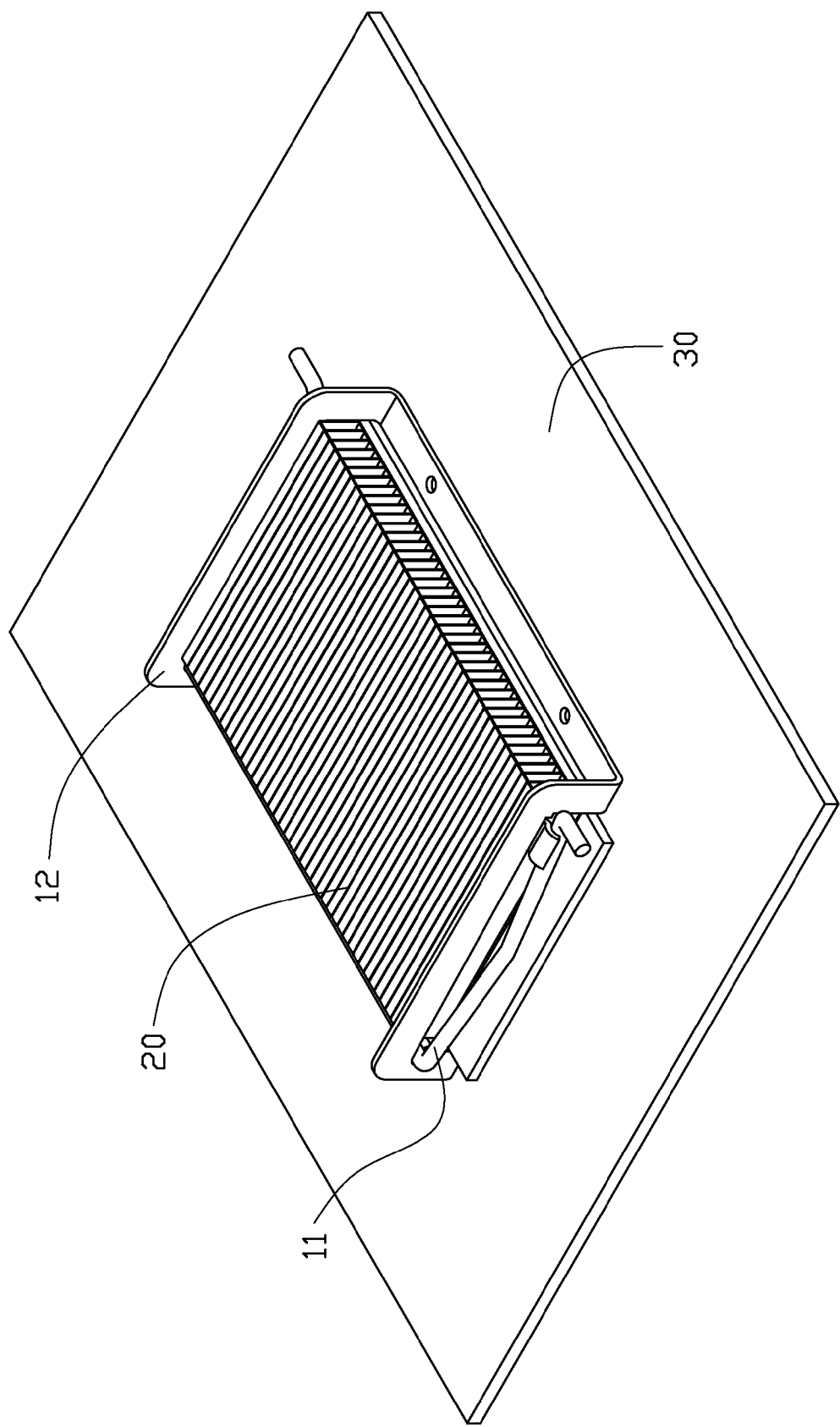
FIG. 4 is an assembled view of the electronic apparatus, in which the resilient arms are moved from FIG. 3 to engage upwardly with the engaging wings.

Referring to FIGS. 3 and 4, in assembly of the electronic apparatus, the heat sink 20 is placed on the heat generating electronic component 40, with thermal grease on a bottom surface of the heat sink 20 adhering to a top surface of the heat generating electronic component 40. The mounting device 10 is placed on the heat sink 20 and around the fin assembly 21, with the mounting holes 1201 of the mounting frame 12 aligning with the through holes 31 of the PCB 30. A plurality of fixing elements (not shown) such as screws extend through the mounting holes 1201 and the through holes 31 in that order, thereby fixing the mounting frame 12 to the PCB 30. The operation portions 115 of the wire clip 11 are pressed downwardly and then inwardly, so that the second resilient portions 114 of the resilient arms 111 slide downwardly along top faces of the engaging wings 1210 and then is received in the notches 1211 of the engaging wings 1210. Therefore, the heat sink 20 is mounted onto the heat generating electronic component 40.

In the illustrated embodiment, the heat sink 20 is urged toward the heat generating electronic component 40 by the resilient force generated by the resilient arms 111 of the wire clip 11. A deformation of the resilient arm 111 can be controlled by controlling a vertical distance between topmost and bottommost surfaces of the resilient arm 111. Therefore, a magnitude of the resilient force generated by the resilient arm 111 can be controlled within a predetermined desired force, which keeps an intimate contact between the heat sink 20 and the heat generating electronic component 40 without damaging the heat generating electronic component 40.

In addition, the heat sink 20 is pressed toward the heat generating electronic component 40 by forces generated by the resilient arms 111, which are arranged at two sides of the mounting frame 12 and have the same structure. Therefore, the forces can be evenly applied on the heat generating electronic component 40 and the thermal grease is evenly compressed between the heat sink 20 and the heat generating electronic component 40. Accordingly, the heat dissipation efficiency of the heat sink 20 is enhanced. Furthermore, the mounting frame 12 and the wire clip 11 are formed by deforming a metal plate and a metal wire, which decreases the cost of the mounting device 10.

It is to be understood, however, that even though numerous characteristics and advantages of the present invention have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electronic apparatus comprising:
    a circuit board with a heat generating electronic component disposed thereon;
    a heat sink for dissipating heat generated by the heat generating electronic component; and
    a mounting device for mounting the heat sink onto the heat generating electronic component, the mounting device comprising:
        a mounting frame surrounding the heat sink, and comprising:
            two first mounting arms;
            two second mounting arms disposed above the first mounting arms, the first mounting arms being configured for abutting on the circuit board, a pair of engaging wings being formed on the second mounting arms; and
            four connecting arms connected between the first mounting arms and the second mounting arms, the connecting arms extending upwardly from the first mounting arms and connecting free ends of the first mounting arms with free ends of the second mounting arms; and
        a wire clip comprising a pivot axle pivotably attached to the mounting frame and two resilient arms at opposite sides of the mounting frame, the resilient arms being configured for abutting against the heat sink and engaging with the pair of engaging wings of the mounting frame, exerting a downward resilient force on the heat sink toward the heat generating electronic component.

2. The electronic apparatus of claim 1, wherein the four connecting arms comprise a pair of first connecting arms connected to one of the first mounting arms, and a pair of second connecting arms connected to the other one of the first mounting arms, and each of the first connecting arms defines a cutout for pivotably receiving the pivot axle of the wire clip.

3. The electronic apparatus of claim 2, wherein a bulge is formed at an opening of the cutout, and a width of the opening of the cutout is less than a diameter of the pivot axle.

4. The electronic apparatus of claim 3, wherein each of the first connecting arms further defines a slot below and adjacent the cutout.

5. The electronic apparatus of claim 2, wherein each of the engaging wings is located at a position remote from the corresponding cutout.

6. The electronic apparatus of claim 1, wherein each of the resilient arms is substantially V-shaped and comprises a first resilient portion, a second resilient portion, an abutting portion and an operation portion, the second resilient portion forming an obtuse angle with the first resilient portion, the abutting portion being formed on a bottom side of the obtuse angle, the operation portion extending outwardly from the second resilient portion.

7. The electronic apparatus of claim 6, wherein each of the engaging wings is substantially C-shaped and a notch is formed at a bottom face of the engaging wing for receiving the second resilient portion of a corresponding resilient arm therein.

8. The electronic apparatus of claim 1, wherein the heat sink comprises a base and a fin assembly arranged on the base, lateral ends of the base spacing a distance from corresponding lateral ends of the fin assembly, two supporting surfaces being formed at the lateral ends of the base, the resilient arms of the wire clip abutting against the supporting surfaces of the heat sink, respectively.

9. A mounting device configured for mounting a heat sink to a circuit board on which a heat generating electronic component is disposed, the mounting device comprising:
  a mounting frame comprising;
  two first mounting arms;
  two second mounting arms disposed above the first mounting arms; and
  four connecting arms connected between the first mounting arms and the second mounting arms, the connecting arms extending upwardly from the first mounting arms and connecting free ends of the first mounting arms with free ends of the second mounting arms;
  a pair of cutouts being defined at one end of the mounting frame and a pair of engaging wings being formed at an opposite end of the mounting frame; and
  a wire clip comprising a pivot axle received in the pair of cutouts and two resilient arms for engaging with the pair of engaging wings and exerting resilient force on the heat sink toward the heat generating electronic component.

10. The mounting device of claim 9, wherein the four connecting arms comprise a pair of first connecting arms connected to one of the first mounting arms, and a pair of second connecting arms connected to the other one of the first mounting arms, the pair of cutouts each being C-shaped and defined in the pair of first connecting arms for receiving the pivot axle therein.

11. The mounting device of claim 10, wherein a bulge is formed at an opening of each of the cutouts, and a width of the opening of each of the cutouts is less than a diameter of the pivot axle.

12. The mounting device of claim 10, wherein each of the first connecting arms further defines a slot below and adjacent the corresponding cutout.

13. The mounting device of claim 9, wherein the resilient arms are perpendicular to the pivot axle, and each resilient arm comprises a linear first resilient portion, a linear second resilient portion, and a linear operation portion, the second resilient portion forming an obtuse angle with the first resilient portion, an abutting portion being formed on a bottom side of the obtuse angle, the operation portion extending outwardly from the second resilient portion.

14. The mounting device of claim 13, wherein each of the engaging wings is substantially C-shaped, and a notch is formed at a bottom face of the engaging wing for receiving the second resilient portion of a corresponding resilient arm therein.

15. An electronic apparatus comprising:
  a circuit board with a heat generating electronic component disposed thereon;
  a heat sink for dissipating heat generated by the heat generating electronic component, the heat sink comprising a base and a fin assembly arranged on the base, lateral ends of the base spacing a distance from corresponding lateral ends of the fin assembly, two supporting surfaces being formed at the lateral ends of the base; and
  a mounting device for mounting the heat sink onto the heat generating electronic component, the mounting device comprising:
    a mounting frame surrounding the heat sink, and comprising two first mounting arms and two second mounting arms disposed above the first mounting arms, the first mounting arms being configured for abutting on the circuit board, a pair of engaging wings being formed on the second mounting arms; and
    a wire clip comprising a pivot axle pivotably attached to the mounting frame and two resilient arms at opposite sides of the mounting frame, the resilient arms abutting against the supporting surfaces of the heat sink and engaging with the pair of engaging wings of the mounting frame, exerting a downward resilient force on the heat sink toward the heat generating electronic component.

* * * * *